United States Patent
Bloos et al.

(10) Patent No.: US 6,420,755 B1
(45) Date of Patent: Jul. 16, 2002

(54) SEMICONDUCTOR DEVICE HAVING A FIELD EFFECT TRANSISTOR AND A METHOD OF MANUFACTURING SUCH A DEVICE

(75) Inventors: Johannes Bloos; Antonius Waltherus Jacobus Petrus Den Boer; Erik Cornelis Egbertus Van Grunsven; Jacob Klerk; Marc Andre De Samber; Johannus Wilhelmus Weekamp, all of Eindoven (NL)

(73) Assignee: Koninklikje Philips Electronics N.V., New York, NY (US)

( * ) Notice: Subject to any disclaimer, the term of this patent is extended or adjusted under 35 U.S.C. 154(b) by 0 days.

(21) Appl. No.: 09/709,663

(22) Filed: Nov. 10, 2000

(30) Foreign Application Priority Data

Nov. 11, 1999 (EP) .............................. 99203769

(51) Int. Cl.[7] .................. H01L 29/76; H01L 29/94; H01L 31/062; H01L 31/113; H01L 31/119
(52) U.S. Cl. .................. 257/328; 257/302; 257/327; 257/329
(58) Field of Search ................. 257/192, 194, 257/244, 276, 280, 284, 288, 302, 327–332, 341, 343, 374, 466, 506, 508, 513, 514, 520, 622, 628, 737, 738, 768, 769, 774, 778; 438/212, 259, 268, 270, 271, 589

(56) References Cited

U.S. PATENT DOCUMENTS 5,225,707 A * 7/1993 Komaru et al. ............. 257/513
5,581,100 A * 12/1996 Ajit ............................ 257/331
5,883,411 A   3/1999 Ueda et al. ................. 257/331
5,917,209 A * 6/1999 Andoh ........................ 257/284
5,969,424 A * 10/1999 Matsuki et al. ............. 257/768

* cited by examiner

Primary Examiner—Michael J. Sherry
Assistant Examiner—Asok Kumar Sarkar
(74) Attorney, Agent, or Firm—Steven R. Biren

(57) ABSTRACT

A field effect transistor (T) of the (quasi-)vertical type, which means that in the semiconductor body (10) of the transistor (T), a source (1) and a drain (3) are positioned (approximately) above each other and are separated from each other by the channel region (2), which is connected to a gate region (4), each one of said regions being connected to a connection conductor (6, 7, 11) joining a connection region (7, 8, 12). The connection regions (7, 8) of the source (1) and the gate (4) are situated on top of the semiconductor body (10). The semiconductor body (10) is provided with a through-hole (9) at least one wall of which is covered with a conductive layer (11), which is connected to the drain (3), and which forms the connection conductor (11) of the drain (3) and which is connected to the connection region (12) for the drain (3) situated on top of the semiconductor body (10). In this way, the transistor (T) is very well suited for surface mounting and is also very easy to manufacture. The through-hole (9) can be made by means of a cheap technique, such as laser cutting or sandblasting. Moreover, the transistor (T) is insensitive to the thickness of the channel region (2), which, in addition, may be comparatively thick. This simplifies the manufacture thereof and renders the transistor (T) suitable for both high power and high voltage applications. An additional advantage is that the transistor (T) can be manufactured without using a comparatively expensive epitaxial process.

8 Claims, 3 Drawing Sheets

SEMICONDUCTOR DEVICE HAVING A FIELD EFFECT TRANSISTOR AND A METHOD OF MANUFACTURING SUCH A DEVICE

BACKGROUND OF THE INVENTION

The invention relates to a semiconductor device having a field effect transistor and comprising a semiconductor body having a stack of, in succession and viewed from the upper surface of the semiconductor body, a first semiconductor region of a first conductivity type, which forms a source of the transistor and is provided with a first connection conductor, a second semiconductor region of a second, opposite conductivity type, and a third semiconductor region of the first conductivity type, which forms a drain of the transistor and is provided with a second connection conductor, and a gate which laterally adjoins the second semiconductor region, by means of which gate a current can be sent between the first and the third semiconductor region and through the second semiconductor region, and which comprises a gate electrode, with the first connection conductor and the gate electrode being connected to, respectively, a first and a second connection region situated on the upper surface of the semiconductor body. Such a device is used, in particular, as a power transistor in, for example, an electronic power supply. Although such a transistor is often considered to be a discrete component, in practice a plurality of other electronic components are often integrated in the semiconductor body. The invention also relates to a method of manufacturing such a device.

A device of the type mentioned in the opening paragraph is known from United States patent specification U.S. Pat. No. 5,883,411, published on Mar. 16, 1999. In said specification, a description is given of a transistor having an $n^+$ type substrate provided with an $n^-$ type epitaxial layer, which form the drain, and a p-type epitaxial layer, which forms a channel region and wherein an $n^+$ type diffusion region is locally present which forms the source of the transistor. In the upper surface of the transistor there is a groove whose wall is covered with an insulating layer, forming the gate oxide, on which the gate electrode is present, which jointly form the gate of the field effect transistor. Source and drain are provided with a connection conductor. The connection conductor of the source, and a part of the gate electrode jointly form a connection region at the upper surface.

A drawback of the known device resides in that it is comparatively bulky because the device is intended, in particular, for power applications. Even for a component that is considered to be a discrete component, the device is comparatively large, which can be attributed to the fact that, in practice, often a number of additional components are still integrated jointly with the transistor.

SUMMARY OF THE INVENTION

Therefore, it is an object of the invention to provide a device which is comparatively small and which, in addition, can be economically manufactured.

To achieve this, a device of the type mentioned in the opening paragraph is characterized in accordance with the invention in that the semiconductor body is provided with a though-hole at least one wall of which is covered with a conductive layer, which is connected to the third semiconductor region and which forms the second connection conductor and is connected to a third connection region situated on the upper surface of the semiconductor body. The invention is based on the recognition that the size of the known device can be reduced comparatively substantially if the protective coating of the transistor and the space necessary for final assembly can be decreased. By providing the semiconductor body with a through-hole the wall of which is covered with a conductive layer, which is connected, on the one hand, with the drain situated on the lower side and, on the other hand, with a connection region situated on the upper side, also the drain of the transistor can be contacted at the upper side. As a result, the device in accordance with the invention can suitably be used for surface mounting and hence both the protective envelope and the space necessary for final assembly can be substantially reduced. The invention is further based on the recognition that such a through-hole can be made very readily and economically, for example by means of laser cutting or sandblasting, and that the conductive layer can be insulated with respect to the channel region in a very simple manner, and that a connection between the conductive layer and the drain can be very readily obtained. As a result, a device in accordance with the invention is not only very small but also inexpensive, which can be partly attributed to the fact that money is saved on the envelope. Preferably, the conductive layer is a metal layer.

In a preferred embodiment of a device in accordance with the invention, the connection regions on the upper surface are provided with means for surface mounting the semiconductor body, said means preferably comprising an array of spherical conductors. In this manner, the advantage of the invention is exploited in full. The device is then secured, for example by means of soldering, onto a support plate provided with a conductor track, for example a PCB (=Printed Circuit Board), with the upper side of the semiconductor body facing the support plate.

In a further very favorable modification, the second semiconductor region comprises a semiconductor substrate wherein, at the upper side and the lower side, respectively, the first and the third semiconductor region are formed by means of diffusion or ion implantation. This modification is connected with an important additional advantage of a device in accordance with the invention. Namely, by using a through-hole, the thickness of the semiconductor body no longer matters, in principle. As a result, the device in accordance with the invention can very suitably be used when the second semiconductor region is a very thick epitaxial layer or even a substrate. The use of a substrate has the important advantage that epitaxy, which is relatively expensive, is superfluous. In addition, the transistor of this modification can very suitably be used at high voltages, which is an important advantage because a high dissipation often involves not only a high current but also a high voltage.

Using the above-mentioned techniques, such as sandblasting or laser cutting, a round through-hole can be readily made. This has the advantage that the semiconductor body is weakened as little as possible by the through-hole. In this case, preferably all walls of the through-hole are covered with the conductive layer, so that the connection resistance of the drain is as low as possible. The through-hole (or the through-holes) may be situated between the various components of the transistor or even within the active region of a (sub-)transistor. (In the latter case) there is preferably an insulating layer or a so-called guard ring in or around the through-hole, at least between the conductive layer and the second semiconductor region, to preclude short-circuits. If the guard ring comprises a doped region, said guard ring does not have to be directly adjacent the walls of the through-hole.

In an important embodiment, the through-hole is slit-shaped. If all the walls of the through-hole are, at least substantially, covered with the conductive layer, then the connection resistance of the drain is very low. If the slit-shaped through-hole is positioned between two neighboring transistors, the through-hole can be "shared" by the two transistors. In this case, the hole is positioned, for this purpose, in the middle of the scratch or saw path which serves to separate two individual transistors from each other. As a result, the term "through-hole" is to be taken to include also, in this application, a recess in a side face of the semiconductor body, which recess extends across the entire thickness of the semiconductor body. Owing to the elongated shape of the through-hole, the drain of the transistor of this modification can still have a very low connection resistance in spite of the fact that the through-hole is shared by two neighboring transistors. This still applies if the end faces of the slit-shaped through-hole are not provided with a conductive layer. This has the important advantage that positioning the slit-shaped through-hole in (the center of) a scratch or saw path does not lead to additional problems because, during sawing the semiconductor body, a saw blade does not have to saw through the conductive layer.

A method of manufacturing a semiconductor device having a field effect transistor and comprising a semiconductor body in which, viewed from the upper surface of the semiconductor body, a stack is formed of a first semiconductor region of a first conductivity type, which forms a source of the transistor and is provided with a first connection conductor, a second semiconductor region of a second, opposite conductivity type and a third semiconductor region of the first conductivity type, which forms a drain of the transistor and is provided with a second connection conductor, and a gate which laterally adjoins the second semiconductor region, by means of which gate a current can be sent between the first and the third semiconductor region and through the second semiconductor region, and which comprises a gate electrode, with the first connection conductor and the gate electrode being connected to, respectively, a first and a second connection region situated on the upper surface of the semiconductor body, characterized in accordance with the invention in that the semiconductor body is provided with a though-hole at least one wall of which is covered with a conductive layer, which is connected to the third semiconductor region and which forms the second connection conductor and is connected to a third connection region situated on the upper surface of the semiconductor body. In this manner, a device in accordance with the invention is obtained in a simple manner. In a preferred embodiment, the through-hole is slit-shaped and positioned next to the transistor at the location of a scratch or saw path, and the conductive layer is formed on the two walls of the through-hole which extend in the longitudinal direction. As a result thereof, the through-hole can be shared by two neighboring transistors and, in addition, across the through-hole a partition can be made, if necessary, to separate two neighboring transistors. In this case, preferably, first all the walls of the through-hole are covered with the conductive layer, after which the walls of the through-hole and the surface of the semiconductor body are covered with a photoresist which is exposed, said photoresist being provided with a mask at the location of the end faces of the through-hole,(said mask being a spot in the case of a negative photoresist and an aperture in the case of a positive photoresist), whereafter the conductive layer on the end faces of the through-hole is removed by means of etching.

These and other aspects of the invention will be apparent from and elucidated with reference to the embodiment(s) described hereinafter.

BRIEF DESCRIPTION OF THE DRAWINGS

In the drawing.

The Figures are diagrammatic and not drawn to scale; particularly the dimensions in the thickness direction being exaggerated for clarity. Corresponding (semiconductor) regions bear the same hatching and the same reference numerals whenever possible.

DESCRIPTION OF THE PREFERRED EMBODIMENTS

Figure 1:
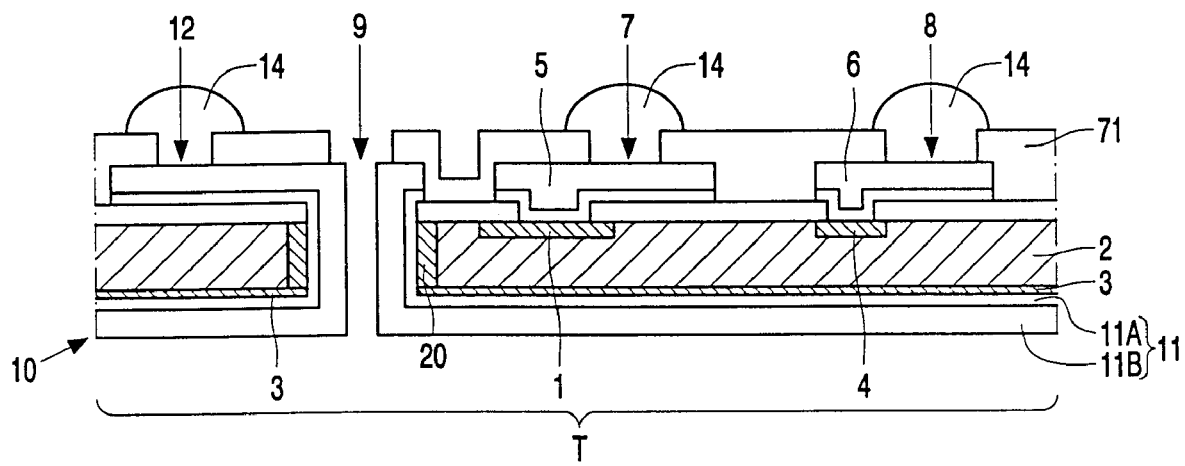
FIG. 1 is a diagrammatic, cross-sectional view, at right angles to the thickness direction, of a semiconductor device in accordance with the invention.
Figure 2:
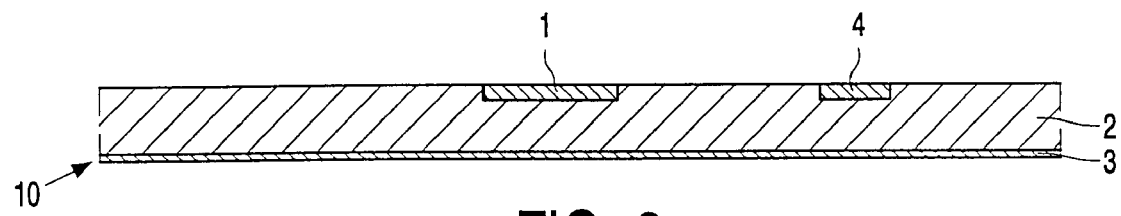
FIGS. 2 through 7 are diagrammatic, cross-sectional views, at right angles to the thickness direction, of the semiconductor device shown in FIG. 1 in successive stages in the manufacturing process using a method in accordance with the invention.
Figure 3:
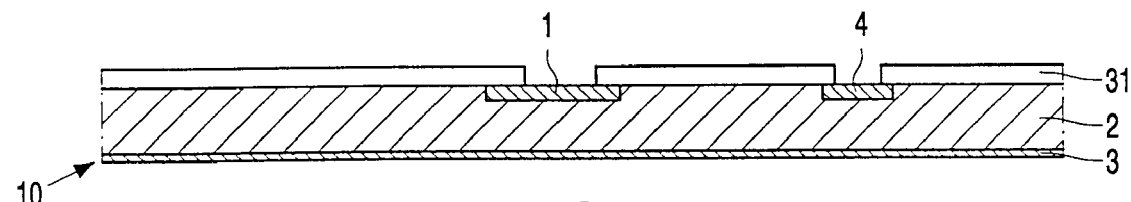
Figure 4:
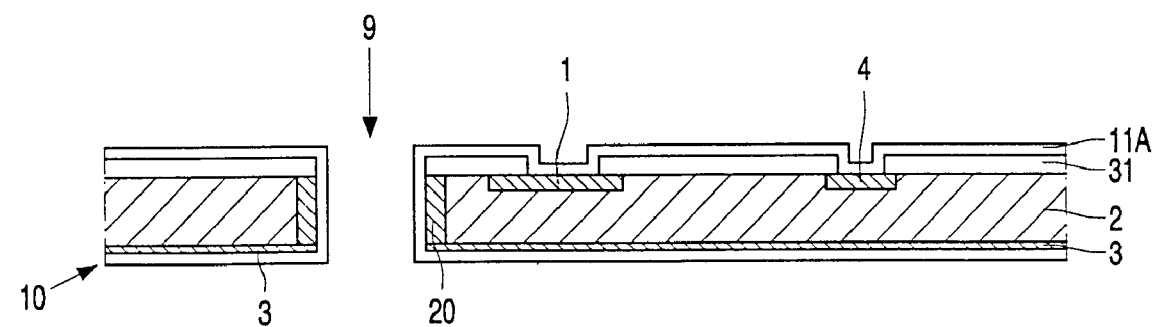
Figure 5:
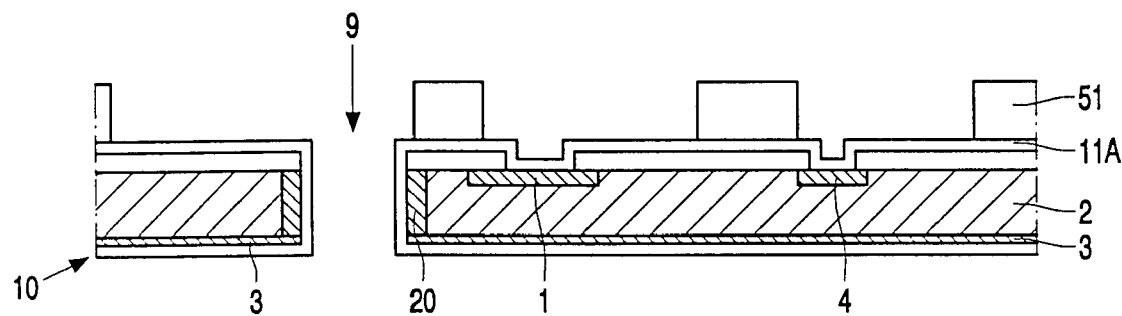
Figure 6:
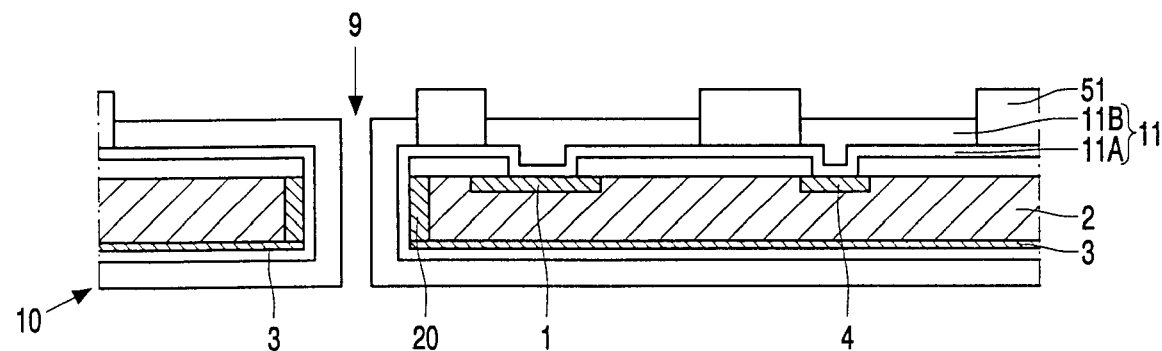
Figure 7:
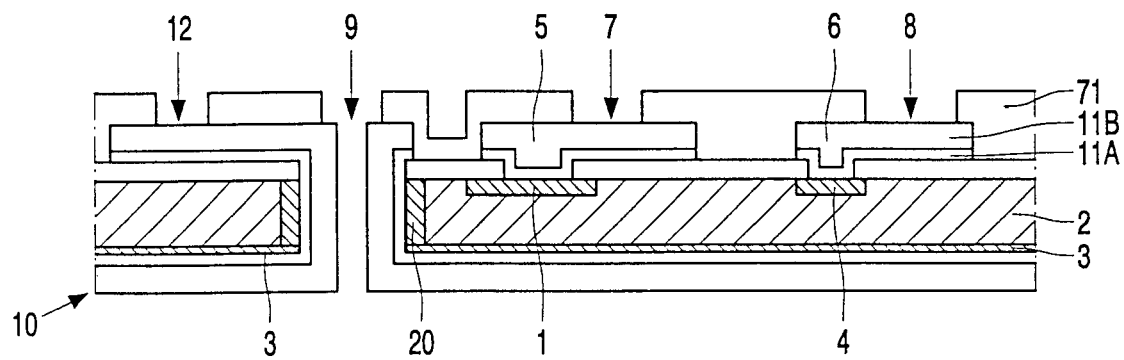

FIG. 1 is a diagrammatic, cross-sectional view, at right angles to the thickness direction, of a semiconductor device in accordance with the invention. The device shows a field effect transistor T. The semiconductor body 10 successively comprises, viewed from the upper surface, a first semiconductor region 1 of a first conductivity type, in this case the n-conductivity type, which forms a source 1 of the transistor T and is provided with a first connection conductor 5. Below said first semiconductor region there is a second semiconductor region 2 of a second, opposite conductivity type, in this case the p-type. Below said second semiconductor region, there is a third semiconductor region of the n-conductivity type, which forms a drain 3 of the transistor T and is provided with a second connection conductor 11. Laterally adjacent the second semiconductor region 2, there is a gate 4 by means of which a current can be sent between the first and the third semiconductor regions 1, 3 and through the second semiconductor region 2, and which gate comprises a gate electrode 6. The gate 4 comprises, in this case, an n-type semiconductor region 4, and the FET (=Field Effect Transistor) is of the junction type, in this case. The first connection conductor 5 and the gate electrode 6 are connected to, respectively, a first and a second connection region 7, 8 situated on the upper surface of the semiconductor body 10.

In accordance with the invention, the semiconductor body 10 is provided with a through-hole 9 at least one wall of which is covered with a conductive layer 11, in this example a metal layer 11, which is connected to the third semiconductor region 3, which forms the second connection conductor 11 and is connected to a third connection region 12 situated on the upper surface of the semiconductor body 10. By virtue thereof, the device in accordance with the invention can be very compact, on the one hand, and can be manufactured very economically, on the other hand. This is based on the recognition that the device in accordance with the invention can suitably be used for surface mounting, due to the fact that the connection regions 7, 8, 12 are all situated in the upper surface, enabling the envelope of the transistor T to be much smaller or even omitted. Also the surface area required for final assembly is minimal. The invention is further based on the recognition that a through-hole 9 in the semiconductor body 10 can be very readily made, for example by means of sandblasting or laser cutting, and also on the recognition that short-circuits between the connective layer 11 and the second semiconductor region 2 can be precluded by a very simple insulation technique, which, in this case, consists in providing an n-type semiconductor region 20 which forms a guard ring around the through-hole 9. In this manner, a very compact device in accordance with the invention can be manufactured very economically.

In the device of this example, the connection regions 7, 8, 12 on the upper surface are provided with means 14 for surface mounting the semiconductor body 10. By virtue thereof, the device can be directly secured onto a support plate, not shown in the drawing, such as a PCB (=Printed Circuit Board), with the transistor T being secured onto a conductor pattern on the support plate by means of, for example, soldering. In this case, the means 14 comprise three spherical conductors 14. In this example, the second semiconductor region 2 comprises a semiconductor substrate 2. In said semiconductor substrate, the first and the third semiconductor region 1, 3 are formed at, respectively, the upper side and the lower side, by means of, in this case, ion implantation followed by diffusion. By virtue thereof, the second semiconductor region 2 may be comparatively thick, for example, in this case, 240 μm. As a result, the transistor T can suitably be used for a high voltage of, for example, 30 to 55 volts, which is an important advantage since, in practice, a high dissipation not infrequently involves a high (operating) voltage. Particularly a device in accordance with the invention is very suitable for this purpose. The reason for this being that the through-hole 9 extends across the entire semiconductor body 10, so that the thickness of the second semiconductor region 2 does not matter. The drain 3 can always be contacted in an equally simple manner.

In this example, the through-hole 9 is elongated, the longitudinal direction extending at right angles to the plane of the drawing. This has the advantage that the connection resistance of the drain 3 is very low, for example 1Ω or even lower. In this example, the metal layer 11 comprises a relatively thin double layer 11A, which includes a titanium layer having a thickness of 55 nm and a copper layer having a thickness of 400 nm, as well as a thicker copper layer 11B having a thickness of 10 μm.

The dimensions of the device in this example are 4.3×4.3 mm$^2$. The thickness is 240 μm, which corresponds to the thickness of the substrate 2. The thickness of the source 1, the drain 3 and the gate region 4 is approximately 5 μm, and these regions have a doping concentration of approximately 5×10$^{18}$ at/cm$^3$. The doping concentration of the channel region 2 is approximately 10$^{14}$ to 10$^{15}$ at/cm$^3$.

FIGS. 2 through 7 are diagrammatic, cross-sectional views, at right angles to the thickness direction, of the semiconductor device of FIG. 1 in successive stages of the manufacturing process, using a method in accordance with the invention. There is started from (see FIG. 2) an approximately 600 μm thick p-type silicon substrate 2, which has been reduced in thickness by polishing to the above-mentioned thickness of approximately 240 μm. At the upper side and the lower side of the semiconductor body, the n-type semiconductor regions 1, 3, 4 are formed by means of diffusion, a mask suitable for the pattern of the regions 1, 4 being used for the upper side, which mask is subsequently removed. Next, (see FIG. 3) a polyimide layer 31 is deposited on the upper side of the semiconductor body 10 and provided with a pattern.

Subsequently, (see FIG. 4), the through-hole 9 is formed in the semiconductor body 10, in this case by means of laser cutting. The width and the length of the, in this case slit-shaped, through-hole 9 is, respectively, 1.2 mm and 100 to 200 μm. Subsequently, the n-type guard ring 20 is formed, for example, by means of implantation, the thickness of said guard ring being approximately 0.5 μm, which may be increased, by means of diffusion, to 5 μm. The guard ring may also be formed, however, by providing an insulating layer 20 on the walls of the through-hole 9. For example by means of plasma etching, the superfluous part of the insulating layer 20, for example of silicon nitride, can be removed from the surface of the semiconductor body 10. Next, a thin double layer 11A of titanium and copper is provided by means of sputtering, and subsequently a thicker copper layer 11B is provided by means of electrochemical deposition.

Next, (see FIG. 5), a photoresist layer 51, which in this case also comprises a polyimide, is provided on the upper surface of the semiconductor body 10 and provided with a pattern. Subsequently, (see FIG. 6), the remaining part 11B of the metal layer, in this case a copper layer 11B, is provided, in this case by means of electrochemical deposition. Subsequently, the photoresist layer 51 is removed and at the location of said photoresist layer the part 11A of the metal layer 11 is removed by etching.

Next, (see FIG. 7) another photoresist layer 71 is applied to the surface and provided with a pattern, whereby the connection regions 7, 8, 12 are exposed. Solder balls 14 are subsequently provided thereon (see FIG. 1), in this example by means of a printing technique. However, this may alternatively be achieved by placement or by means of an electrochemical deposition technique. In this example, the use of the polyimide layer 31 has the important advantage that the solder balls 14 and hence the connection regions 7, 8, 12 do not have to be situated, viewed in projection, above, for example, the source region 1 and the gate region 4. This can be attributed to the fact that such a polyimide layer 31 is comparatively flexible and compressible, thereby allowing the solder balls 14 to be more freely placed, as is the case in this example. Furthermore, in this example, the rear side of the semiconductor body is covered with an insulating coating, not shown in the drawing. Individual transistors are obtained by means of sawing in saw paths, not shown either in the drawing, which, for this purpose, are kept free of metal and, possibly, other applied layers such as a synthetic resin layer, for example of polyimide.

Figure 8:
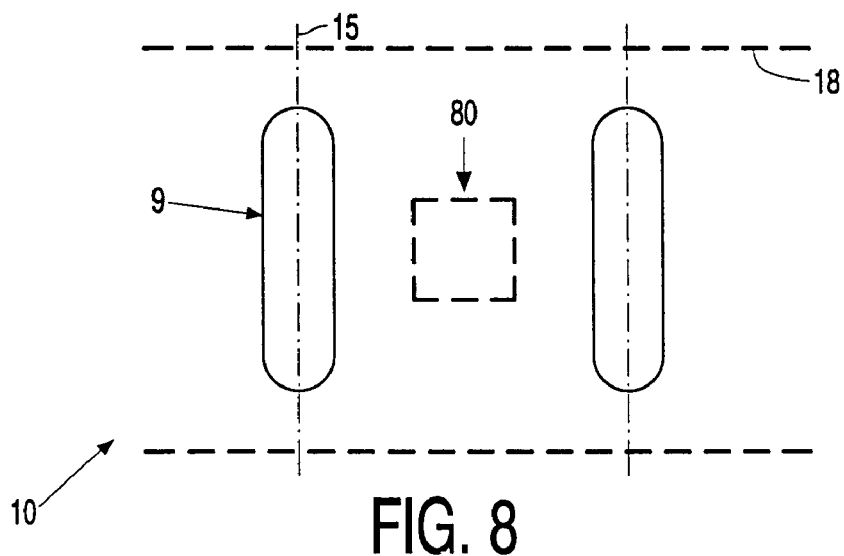
FIGS. 8 through 10 are diagrammatic, plan views of a modification of the device shown in FIG. 1 in successive stages in the manufacturing process using a modification of the method as shown in FIGS. 2 through 7.
Figure 9:
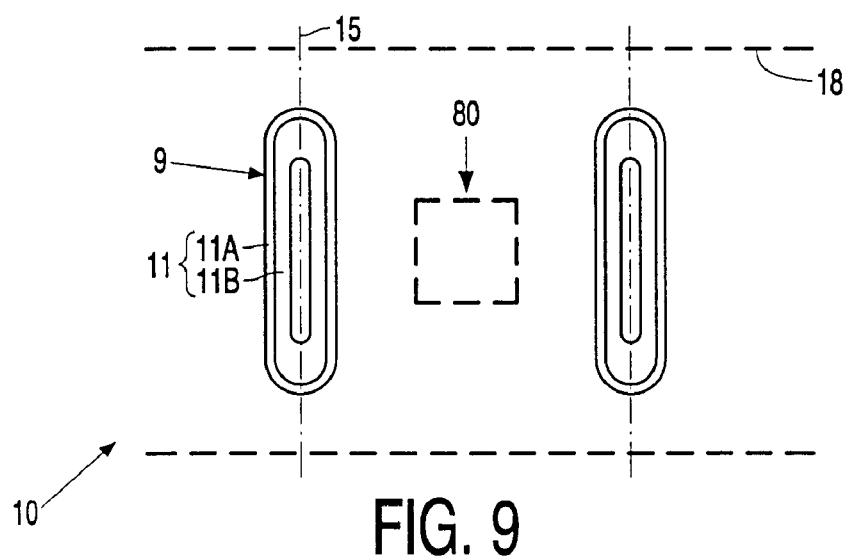
Figure 10:
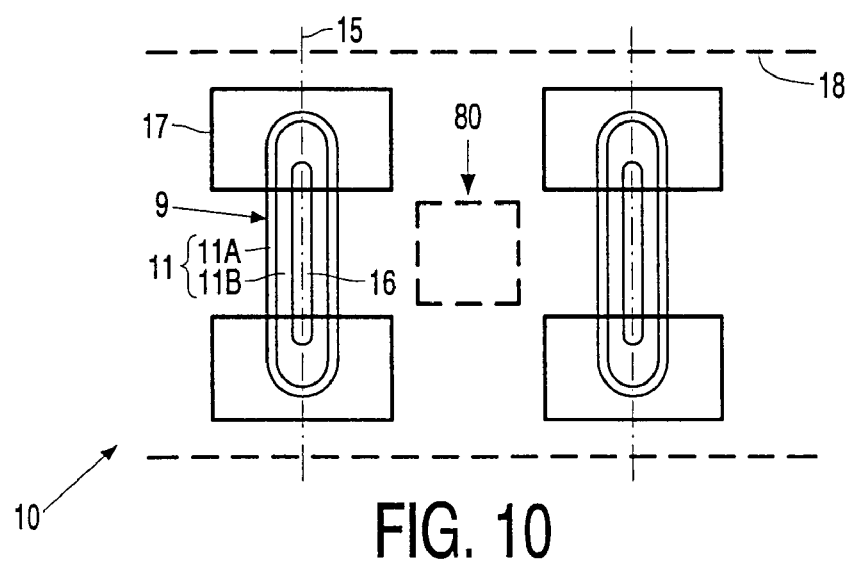

FIGS. 8 through 10 are diagrammatic, plan views of a modification of the device of FIG. 1 in successive stages in the manufacture process using a modification of the method of FIGS. 2 through 7. FIG. 8 shows the stage in the manufacture where a slit-shaped through-hole 9 is formed in the semiconductor body 10. In the region referenced 80, there is (the active part of) the field effect transistor T. The through-hole 9 is positioned in a saw path 15, by means of which the transistors T are separated from each other. In the other direction, this takes place by means of a second saw path 18. Subsequently, see FIG. 9, the metal layer 11 is provided. Next, the remaining part of the through-hole 9 is filled with a photoresist and the surface of the semiconductor body is covered with photoresist. Next, see FIG. 10, the photoresist is exposed using a mask 17 which is such that the photoresist can be removed by developing at the location of the end face of the through-hole 9. At the location of this end face, the metal layer 11 is then removed by means of etching. In this manner, sawing of metal is not necessary in the sawing operation of the semiconductor body 10. Furthermore, in this modification, the through-hole 9 is shared, as it were, by two neighboring transistors T.

The invention is not limited to the above example, and, within the scope of the invention, many variations and modifications are possible to those skilled in the art. For example, the transistor may also be of a type other than the so-called junction type. An important variant comprises a so-called MOS (=Metal Oxide Semiconductor) transistor which may, or may not, be of the so-called "trench" type.

Besides, thicknesses and compositions other than those mentioned hereinabove can be used for the various (semiconductor) regions. Also deposition techniques other than those used in the example may be chosen to provide the various (semiconductor) regions. It is also possible to simultaneously change all conductivity types to the opposite conductivity types. Also regarding the structure and the manufacture of the device, many modifications are possible. The invention relates, in particular, to so-called discrete devices, however, in practice such devices are often found to be more complex than devices comprising a single transistor. A plurality of electronic, active or passive components will often be integrated in the semiconductor body of the device.

What is claimed is:

1. A semiconductor device having a field effect transistor (T) and comprising a semiconductor body (10) having a stack of, in succession and viewed from the upper surface of the semiconductor body (10), a first semiconductor region (1) of a first conductivity type, which forms a source (1) of the transistor (T) and is provided with a first connection conductor (5), a second semiconductor region (2) of a second, opposite conductivity type, and a third semiconductor region (3) of the first conductivity type, which forms a drain (3) of the transistor (T) and is provided with a second connection conductor (11), and a gate (4) which laterally adjoins the second semiconductor region (2), by means of which gate a current can be sent between the first and the third semiconductor region (1, 3) and through the second semiconductor region (2), and which comprises a gate electrode (6), with the first connection conductor (5) and the gate electrode (6) being connected to, respectively, a first and a second connection region (7, 8) situated on the upper surface of the semiconductor body (10), characterized in that the semiconductor body (10) is provided with a through-hole (9) at least one wall of which is covered with a conductive layer (11), which is connected to the third semiconductor region (3) and which forms the second connection conductor (11) and is connected to a third connection region (12) situa semiconductor body (10).

2. A semiconductor device as claimed in claim 1, characterized in that the connection regions (7, 8, 12) on the upper surface are provided with means (14) for surface mounting the semiconductor body (10), said means preferably comprising an array of spherical conductors (14).

3. A semiconductor device as claimed in claim 1, characterized in that the second semiconductor region (2) comprises a semiconductor substrate (2) wherein, at the upper side and the lower side, respectively, the first and the third semiconductor region (1, 3) are formed by means of diffusion or ion implantation.

4. A semiconductor device as claimed in claim 1, 2 or 3, characterized in that the through-hole (9) is round.

5. A semiconductor device as claimed in claim 1, characterized in that the through-hole (9) is slit-shaped.

6. A semiconductor device as claimed in claim 5, characterized in that the through-hole (9) is situated at the location of a scratch or saw path (15) next to the transistor (T), and the conductive layer (11) is situated on the two walls of the through-hole (9) which extend in the longitudinal direction of said through-hole (9).

7. A semiconductor device as claimed in claim 1, characterized in that the parts of the second semiconductor region (2) adjoining the walls of the through-hole (9) are of the first conductivity type or are covered with an insulating layer (20).

8. A support plate provided with a conductor pattern on which a semiconductor device as claimed in claim 1 is situated, the connection regions (7, 8, 12) on the upper surface of the semiconductive body (10) being electrically connected to the conductor pattern.

* * * * *